US009070835B2

(12) United States Patent
Yoon et al.

(10) Patent No.: US 9,070,835 B2
(45) Date of Patent: Jun. 30, 2015

(54) SEMICONDUCTOR LIGHT EMITTING DEVICE

(71) Applicant: SAMSUNG ELECTRONICS CO., LTD., Suwon-si, Gyeonggi-do (KR)

(72) Inventors: Ju Heon Yoon, Hwaseong-si (KR); Sang Yeon Kim, Seongnam-si (KR); Seung Hwan Lee, Suwon-si (KR); Jin Hyun Lee, Suwon-si (KR); Wan Tae Lim, Suwon-si (KR); Hyun Kwon Hong, Cheonan-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/146,689

(22) Filed: Jan. 2, 2014

(65) Prior Publication Data
US 2014/0312369 A1 Oct. 23, 2014

(30) Foreign Application Priority Data

Apr. 19, 2013 (KR) .......... 10-2013-0043386

(51) Int. Cl.
H01L 33/38 (2010.01)
H01L 33/40 (2010.01)
H01L 33/44 (2010.01)
H01L 33/20 (2010.01)

(52) U.S. Cl.
CPC ........... *H01L 33/382* (2013.01); *H01L 2224/13* (2013.01); *H01L 33/20* (2013.01); *H01L 33/40* (2013.01); *H01L 33/44* (2013.01); *H01L 2933/0016* (2013.01)

(58) Field of Classification Search
None
See application file for complete search history.

(56) References Cited

U.S. PATENT DOCUMENTS

| 6,891,197 | B2 | 5/2005 | Bhat et al. |
| 7,235,818 | B2 | 6/2007 | Kim et al. |
| 7,456,438 | B2 | 11/2008 | Lee et al. |
| 7,973,303 | B2 | 7/2011 | Sakong et al. |
| 2006/0261358 | A1 | 11/2006 | Hwang et al. |
| 2010/0006883 | A1 | 1/2010 | Slater, Jr. et al. |
| 2012/0267673 | A1* | 10/2012 | Okabe et al. .................. 257/99 |
| 2014/0312369 | A1* | 10/2014 | Yoon et al. .................. 257/96 |

FOREIGN PATENT DOCUMENTS

| KR | 20060109375 A | 10/2006 |
| KR | 100764450 B1 | 10/2007 |

* cited by examiner

*Primary Examiner* — Joseph Schoenholtz
(74) *Attorney, Agent, or Firm* — McDermott Will & Emery LLP

(57) ABSTRACT

A semiconductor light emitting device including a light emitting structure including a first conductivity type semiconductor layer, an active layer, and a second conductivity type semiconductor layer; a first electrode connected to the first conductivity type semiconductor layer; a second electrode including a contact layer connected to the second conductivity type semiconductor layer, a capping layer disposed on the contact layer, and a metal buffer layer disposed on the capping layer, the metal buffer layer encompasses an upper and lateral surface of the capping layer; a first insulating layer disposed on the light emitting structure such that the first and second electrodes are exposed; and a second insulating layer disposed on the first insulating layer such that at least a portion of the first electrode and at least a portion of the metal buffer layer are exposed.

14 Claims, 11 Drawing Sheets

SEMICONDUCTOR LIGHT EMITTING DEVICE

CROSS-REFERENCE TO RELATED APPLICATION

This application claims the priority to, and the benefit of, Korean Patent Application No. 10-2013-0043386 filed on Apr. 19, 2013, with the Korean Intellectual Property Office, the disclosure of which is incorporated herein by reference.

TECHNICAL FIELD

The present disclosure relates to a semiconductor light emitting device.

BACKGROUND

A light emitting diode (LED) is a semiconductor device which is able to emit light of various colors due to electron-hole recombination occurring at a p-n junction between p-type and n-type semiconductors when current is applied thereto. Such an LED is advantageous over a filament-based light emitting device in that it has a relatively long lifespan, low power consumption, superior initial-operation characteristics, and the like. These factors have continually boosted the demand for LEDs. Notably of late, a great deal of attention has been given to group III nitride semiconductors that can emit light in a blue/short wavelength region.

Since the development of nitride semiconductor devices, technical advances to broaden the range of applications thereof have been made. Thus, many studies are being conducted into determining how to utilize nitride semiconductor devices in general lighting apparatuses and electrical lighting sources. According to the related art, nitride light emitting devices have been used as components employed in low-current, low output mobile products. However, of late, the range of applications of nitride light emitting devices has been broadened to encompass the field of high-current, high-output products. Accordingly, research into improvements in light emitting efficiency and the quality of semiconductor light emitting devices is being actively carried out. Particularly, light emitting devices having various electrode structures are being developed in order to improve light output amounts and reliability thereof.

SUMMARY

An aspect of the present disclosure provides a semiconductor light emitting device having improved reliability by preventing the occurrence of cracks in electrodes and insulating layers around the electrodes.

According to an aspect of the present disclosure, there is provided a semiconductor light emitting device including: a light emitting structure including a first conductivity type semiconductor layer, an active layer, and a second conductivity type semiconductor layer; a first electrode connected to the first conductivity type semiconductor layer; a second electrode including a contact layer connected to the second conductivity type semiconductor layer, a capping layer disposed on the contact layer, and a metal buffer layer disposed on the capping layer, the metal buffer layer encompasses an upper and lateral surface of the capping layer; a first insulating layer disposed on the light emitting structure such that the first and second electrodes are exposed; and a second insulating layer disposed on the first insulating layer such that at least a portion of the first electrode and at least a portion of the metal buffer layer are exposed.

The first electrode and the metal buffer layer may be formed of the same material.

The metal buffer layer may be thicker than the contact layer or the capping layer.

A gap may be arranged between the capping layer and the first insulating layer, and the gap may be filled with the metal buffer layer.

The metal buffer layer may encompass an end portion of the first insulating layer.

The metal buffer layer may be formed of a material having a higher degree of fracture toughness than that of the capping layer.

The capping layer may include a capping surface layer contacting the metal buffer layer, the capping surface layer being formed of at least one of Cr, Pt and Au.

The capping layer may include at least one of Ti and Ni, and the metal buffer layer may include at least one of Au, Ag, Al, Pt, Fe, Cu, Sn, Pb, Ni, and Pd, and alloys thereof.

The first electrode may be disposed on a part of the first conductivity type semiconductor layer exposed by etching a portion of the light emitting structure.

The first insulating layer may extend from an exposed part of the first conductivity type semiconductor layer to a top of the second conductivity type semiconductor layer, the first insulating layer covering a lateral surface of the light emitting structure.

The first electrode and the second electrode may be disposed in the same direction.

The semiconductor light emitting device may further include a first pad electrode disposed on the first electrode and a second pad electrode disposed on a portion of the metal buffer layer exposed by the second insulating layer.

The first electrode may include at least one conductive via penetrating through the second conductivity type semiconductor layer and the active layer and connected to the first conductivity type semiconductor layer.

According to another aspect of the present disclosure, there is provided a semiconductor light emitting device including: a light emitting structure including a first conductivity type semiconductor layer, an active layer, and a second conductivity type semiconductor layer; first and second electrodes connected to the first and second conductivity type semiconductor layers, respectively; an insulating layer disposed on the first and second electrodes; and a metal buffer layer interposed between the second electrode and the insulating layer and encompassing an end portion of the second electrode.

The metal buffer layer and the first electrode may be formed of the same material.

According to another aspect of the present disclosure, there is provided a semiconductor light emitting device including: a light emitting structure including a first conductivity type semiconductor layer, an active layer, and a second conductivity type semiconductor layer; first and second electrodes connected to the first and second conductivity type semiconductor layers, respectively; an insulating layer disposed on the first and second electrodes; and a metal buffer layer disposed on the second electrode, wherein the metal buffer layer includes a structural characteristic such that the metal buffer layer has a higher crack resistance than the second electrode.

The structural characteristic may be at least one of thickness, material, and shape.

The structural characteristic may include material, the metal buffer layer being formed of a material having a higher degree of fracture toughness than that of the second electrode.

The structural characteristic may include material, the metal buffer layer being formed of a material having a higher degree of ductility and malleability than that of the second electrode.

The metal buffer layer may be arranged on a side surface of at least one of the second electrode and the insulating layer.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF EXEMPLARY EMBODIMENTS

Figure 1:
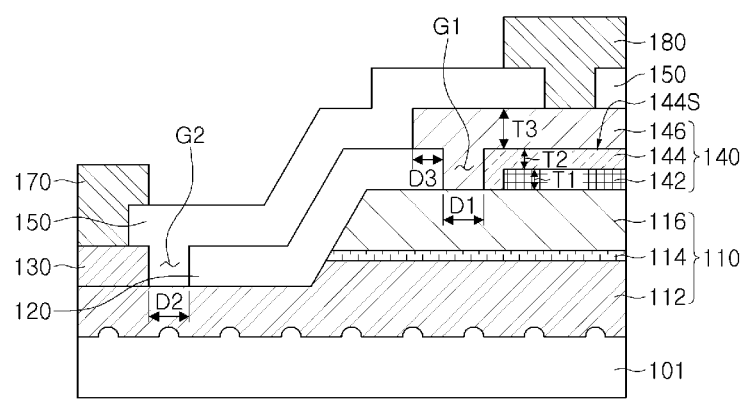
FIG. 1 is a schematic cross-sectional view illustrating a semiconductor light emitting device according to an exemplary embodiment of the present disclosure.

Exemplary embodiments of the present disclosure will now be described in detail with reference to the accompanying drawings.

Inventive concepts may, however, be exemplified in many different forms and should not be construed as being limited to the specific embodiments set forth herein. Rather, these embodiments are provided so that this disclosure will be thorough and complete, and will fully convey the scope of the present disclosure to those having ordinary skill in the art.

In the drawings, the shapes and dimensions of elements may be exaggerated for clarity, and the same or like reference numerals will be used throughout to designate the same or like elements.

FIG. 1 is a schematic cross-sectional view illustrating a semiconductor light emitting device according to an exemplary embodiment of the present disclosure.

With reference to FIG. 1, a semiconductor light emitting device 100 may include a substrate 101 and a light emitting structure 110 formed on the substrate 101, the light emitting structure 110 including a first conductivity type semiconductor layer 112, an active layer 114 and a second conductivity type semiconductor layer 116. In addition, the semiconductor light emitting device 100 may have an electrode structure including first and second electrodes 130 and 140, and first and second pad electrodes 170 and 180 formed on the first and second electrodes 130 and 140, respectively, and may further include first and second insulating layers 120 and 150 formed on the light emitting structure 110.

Here, the terms, 'top,' 'top portion,' 'top surface,' 'bottom,' 'bottom portion,' 'bottom surface,' 'lateral surface,' and the like, are based on the directionality of the drawings, which may be changed according to a direction in which a semiconductor light emitting device or a package is actually mounted.

The substrate 101 may be provided as a semiconductor growth substrate, and may be formed of a semiconductor material having insulation or conductivity properties, such as sapphire, SiC, $MgAl_2O_4$, MgO, $LiAlO_2$, $LiGaO_2$, GaN or the like. The substrate 101 may allow light emitted from the active layer 114 to be transmitted therethrough. When the semiconductor light emitting device 100 is to be used in a package, a light source module or the like, the substrate 101 may be disposed upwardly in a flip-chip manner. Sapphire, which is generally used as a substrate for nitride semiconductor growth, is a crystal having electrically insulating properties and Hexa-Rhombo R3C symmetry, and has a lattice constant of 13.001 Å along a C-axis and a lattice constant of 4.758 Å along an A-axis. Orientation planes of the sapphire include a C (0001) plane, an A (1120) plane, an R (1102) plane, and the like. Particularly, the C plane is mainly used for nitride growth because it relatively facilitates the growth of a nitride film and is stable at high temperatures. Meanwhile, as shown in FIG. 1, a plurality of uneven structures are formed on a top surface of the substrate 101, that is, a growth surface for semiconductor layers. These uneven structures may improve the crystallinity and light emitting efficiency of the semiconductor layers. However, the uneven structures are not essential, and may be omitted.

The light emitting structure 110 may include the first conductivity type semiconductor layer 112, the active layer 114 and the second conductivity type semiconductor layer 116 sequentially stacked on the substrate 101. The first and second conductivity type semiconductor layers 112 and 116 may be formed of semiconductors doped with n-type and p-type impurities, respectively. Alternatively, the first and second conductivity type semiconductor layers 112 and 116 may be formed of semiconductors doped with p-type and n-type impurities, respectively. For example, the first and second conductivity type semiconductor layers 112 and 116 may be formed of nitride semiconductors expressed by $Al_xIn_yGa_{1-x-y}N$ ($0 \leq x \leq 1$, $0 \leq y \leq 1$, $0 \leq x+y \leq 1$). The materials of the first and second conductivity type semiconductor layers 112 and 116 are not particularly limited, and AlGaInP semiconductors, AlGaAs semiconductors or the like may also be used therefor.

The active layer 114 is interposed between the first and second conductivity type semiconductor layers 112 and 116, and emits light having a predetermined level of energy through electron-hole recombination. The active layer 114 may include a material having an energy band gap less than that of the first and second conductivity type semiconductor layers 112 and 116. For example, when the first and second conductivity type semiconductor layers 112 and 116 are formed of GaN-based compound semiconductors, the active layer 114 may include InAlGaN-based compound semiconductors having an energy band gap less than that of the GaN-based compound semiconductors. In addition, the active layer 114 may have a multi-quantum well (MQW) structure in which quantum well layers and quantum barrier layers are alternately laminated. For example, an InGaN/GaN structure may be used.

The first and second insulating layers 120 and 150 may be formed of any material having electrically insulating properties. In addition, a material having a minimum degree of light absorption as well as having electrically insulating properties may be used therefor. For example, a silicon oxide or a silicon nitride, such as $SiO_2$, $SiO_xN_y$, $Si_xN_y$, or the like, may be used.

The first insulating layer 120 may extend from a portion of the first conductivity type semiconductor layer 112 exposed in a mesa-etched region of the light emitting structure 110 to a top of the second conductivity type semiconductor layer 116, while covering an etched lateral surface of the light emitting structure 110. The first insulating layer 120 may be disposed between the first and second electrodes 130 and 140.

The second insulating layer 150 may be disposed on the first insulating layer 120 while allowing at least a portion of the first electrode 130 and a metal buffer layer 146 to be exposed therefrom.

The first and second electrodes 130 and 140 may be provided to allow the first and second conductivity type semiconductor layers 112 and 116 to be electrically connected to an external device outside of the semiconductor light emitting device 100, such that the first and second electrodes 130 and 140 may be connected to the first and second conductivity type semiconductor layers 112 and 116, respectively. The first and second electrodes 130 and 140 may be disposed in the same direction based on the substrate 101.

The first electrode 130 may be disposed on the exposed portion of the first conductivity type semiconductor layer 112, in the mesa-etched region of the light emitting structure 110. The first electrode 130 may have a single layer structure or a multilayer structure formed of a conductive material having ohmic properties with the first conductivity type semiconductor layer 112. For example, the first electrode 130 may include at least one of Au, Ag, Cu, Zn, Al, In, Ti, Si, Ge, Sn, Mg, Ta, Cr, W, Ru, Rh, Ir, Ni, Pd, and Pt, and alloys thereof.

The second electrode 140 may include a contact layer 142 connected to the second conductivity type semiconductor layer 116, a capping layer 144 encompassing at least a portion of the contact layer 142, and the metal buffer layer 146 encompassing at least a portion of the capping layer 144, as shown in FIG. 1.

The contact layer 142 may have a single layer structure or a multilayer structure formed of a conductive material having ohmic properties with the second conductivity type semiconductor layer 116. For example, the contact layer 142 may include at least one of Ag, Ti, and Ni, and alloys thereof.

The capping layer 144 may include at least one of Ti and Ni. For example, the capping layer 144 may have a multilayer structure in which Ti and Ni layers are alternately stacked. The capping layer 144 may include a capping surface layer 144S having a high degree of chemical resistance. For example, the capping surface layer 144S may be formed of at least one of Cr, Pt, and Au.

The metal buffer layer 146 may be formed on the capping layer 144 to encompass, for example, top and lateral surfaces of the capping layer 144. The metal buffer layer 146 may include at least one of Au, Ag, Al, Pt, Fe, Cu, Sn, Pb, Ni, and Pd, and alloys thereof, and may be formed of the same material as that of the first electrode 130. According to various exemplary embodiments, the metal buffer layer 146 may be formed of a material having relatively high degrees of ductility and malleability as compared to the capping layer 144. In addition, the metal buffer layer 146 may be formed of a material having a higher degree of fracture toughness than that of the capping layer 144. However, even if the metal buffer layer 146 is formed of a material having a lower degree of fracture toughness than that of the capping layer 144, the metal buffer layer 146 may have a superior capability to prevent the propagation of fractures as compared to the capping layer 144, due to the thickness and shape of the metal buffer layer 146.

Therefore, when the semiconductor light emitting device 100 is bonded to an external device such as a package substrate or the like, the metal buffer layer 146 may prevent cracks from occurring in an edge of the contact layer 142 or the capping layer 144 due to stress caused by a difference in the coefficients of thermal expansion (CTE) between the semiconductor light emitting device 100 and the external device, or may prevent cracks from being propagated toward the first and second insulating layers 120 and 150.

The contact layer 142 has a first thickness T1, the capping layer 144 has a second thickness T2, and the metal buffer layer 146 has a third thickness T3. The third thickness T3 may be greater than the first thickness T1, and the third thickness T3 may be equal to or greater than the second thickness T2. This is because the metal buffer layer 146 may fail to prevent the propagation of cracks if the metal buffer layer 146 is relatively thin.

A first gap G1 may be formed between the capping layer 144 and the first insulating layer 120. The first gap G1 may be filled with the metal buffer layer 146, and a size D1 of the first gap G1 is not limited to that shown in FIG. 1 but may be changed according to varying embodiments. For example, the size D1 of the first gap G1 may be greater than the third thickness T3 of the metal buffer layer 146, in order to allow the metal buffer layer 146 to sufficiently encompass the edge of the capping layer 144 on which stress is concentrated when the semiconductor light emitting device 100 is bonded as described above. A second gap G2 may be formed between the first electrode 130 and the first insulating layer 120. The second gap G2 may be filled with the second insulating layer 150, and a size D2 of the second gap G2 is not limited to that shown in FIG. 1 but may be changed according to varying embodiments. In addition, the second gap G2 may not be present according to varying embodiments.

The metal buffer layer 146 may be formed to encompass an end portion of the first insulating layer 120 adjacent to the capping layer 144. A distance D3 of an overlap portion between the metal buffer layer 146 and the first insulating layer 120 is not limited to that shown in FIG. 1 but may be changed according to varying embodiments. When the metal buffer layer 146 includes a reflective material, light extraction efficiency may be improved relatively to an increase in the distance D3. According to various alternative embodiments, the metal buffer layer 146 may not overlap the first insulating layer 120.

The first and second pad electrodes 170 and 180 may function as external terminals of the semiconductor light emitting device 100. The first and second pad electrodes 170 and 180 may be formed of the same material, and for example, may include at least one of Ag, Al, Ni, Cr, Pd, Cu, Pt, Sn, W, Au, Rh, Ir, Ru, Mg, and Zn, and alloys thereof. The first and second pad electrodes 170 and 180 may be formed of a eutectic metal such as AuSn, CuSn or the like, and the first and second pad electrodes 170 and 180 may be bonded by eutectic bonding when the semiconductor light emitting device 100 is mounted in a package or the like. According to various exemplary embodiments, the first and second pad electrodes 170 and 180 may have the same or similar height, and widths of the first and second pad electrodes 170 and 180 are not limited to those shown in FIG. 1.

Figure 2A:
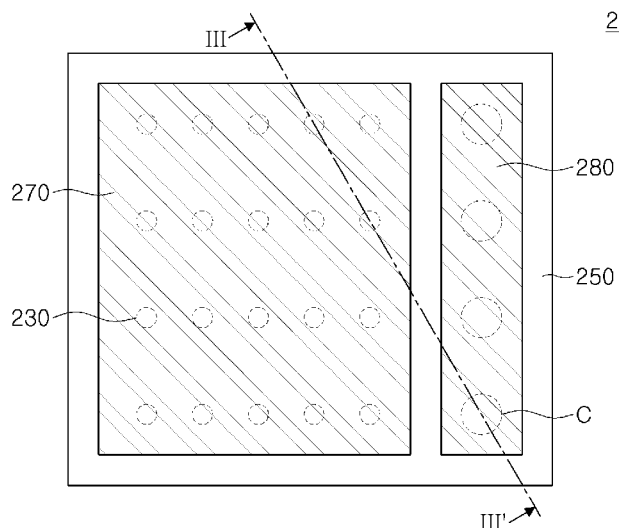
FIGS. 2A and 2B are schematic plan views illustrating a semiconductor light emitting device according to an exemplary embodiment of the present disclosure.
Figure 2B:
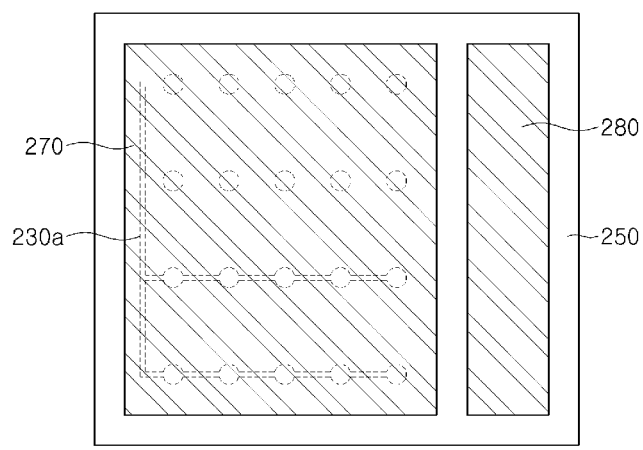

FIGS. 2A and 2B are schematic plan views illustrating a semiconductor light emitting device according to an exemplary embodiment of the present disclosure.

Figure 3:
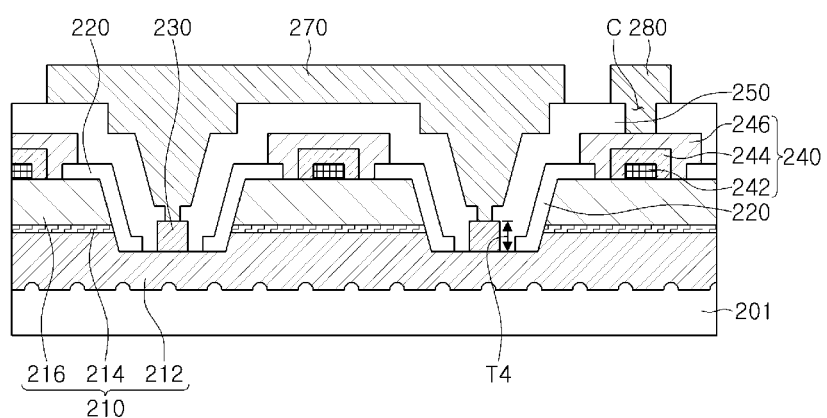
FIG. 3 is a schematic cross-sectional view illustrating the semiconductor light emitting device according to an exemplary embodiment of the present disclosure, taken along line III-III' of FIG. 2A.

FIG. 3 is a schematic cross-sectional view illustrating the semiconductor light emitting device according to an exemplary embodiment of the present disclosure, taken along line III-III' of FIG. 2A.

With reference to FIGS. 2A through 3, a semiconductor light emitting device 200 may include a substrate 201 and a light emitting structure 210 formed on the substrate 201, the light emitting structure 210 including a first conductivity type semiconductor layer 212, an active layer 214 and a second conductivity type semiconductor layer 216. In addition, the semiconductor light emitting device 200 may have an electrode structure including first and second electrodes 230 and 240, and first and second pad electrodes 270 and 280 formed on the first and second electrodes 230 and 240, respectively, and may further include first and second insulating layers 220 and 250 formed on the light emitting structure 210.

In the present exemplary embodiment, the first electrode 230 may be formed as a conductive via penetrating through the second conductivity type semiconductor layer 216 and the active layer 214 to thereby be connected to the first conductivity type semiconductor layer 212. At least a portion of the first electrode 230 may be encompassed by the first and second insulating layers 220 and 250 to thereby be electrically isolated from the active layer 214 and the second conductivity type semiconductor layer 216. The first electrode 230 may be disposed on an etched region of the light emitting structure 210, and a degree of inclination of a lateral surface of the light emitting structure 210 may be changed according to varying embodiments. In order to reduce contact resistance, the first electrode 230 may be appropriately adjusted in terms of number, shape, pitch, and an area thereof in contact with the first conductivity type semiconductor layer 212. In addition, as shown in FIGS. 2A and 2B, a plurality of first electrodes 230 and 230a may be arranged in rows and columns to thereby improve current flow.

As shown in FIG. 2B, adjacent first electrodes 230a of a semiconductor light emitting device 200a formed as vias may be connected to one another in a unidirectional manner, such that the second electrode 240 may be separated by the connected first electrodes 230a. This electrode structure may lead to a reduction in stress around the first electrodes 230a, thereby preventing delamination of the second electrode 240. In the present exemplary embodiment, the first electrode 230a may further include a line-shaped region connecting a row of first electrodes to another row of first electrodes. The position of the line-shaped region may be changed according to varying embodiments.

A height T4 of the first electrode 230 is not limited to that shown in FIG. 3 but may be changed according to varying embodiments. For example, in a modified embodiment, a height of a top surface of the first electrode 230 may be equal to or similar to that of a bottom surface of the second electrode 240.

The second electrode 240 may include a contact layer 242 connected to the second conductivity type semiconductor layer 216, a capping layer 244 encompassing at least a portion of the contact layer 242, and a metal buffer layer 246 encompassing at least a portion of the capping layer 244, as shown in FIG. 3.

The metal buffer layer 246 may be formed on the capping layer 244 to encompass, for example, top and lateral surfaces of the capping layer 244. The metal buffer layer 246 may be formed of the same material as that of the first electrode 230 and in the same process. The metal buffer layer 246 may be thicker than the capping layer 244, and may be formed of a material having a higher degree of fracture toughness than that of the capping layer 244.

Therefore, when the semiconductor light emitting device 200 is bonded to an external device such as a package substrate or the like, the metal buffer layer 246 may reduce the occurrence of cracks in the contact layer 242 or the capping layer 244 due to a difference in the coefficients of thermal expansion between the semiconductor light emitting device 200 and the external device, and may prevent cracks from being propagated toward the first and second insulating layers 220 and 250.

The first and second pad electrodes 270 and 280 may function as external terminals of the semiconductor light emitting device 200. As described above, the height T4 of the first electrode 230 in contact with the first pad electrode 270 may be changed according to varying embodiments. The second pad electrode 280 may include a contact area C connected to the second electrode 240, and the contact area C may have the form of a hole as shown in FIGS. 2A and 3. However, the present disclosure is not limited thereto, and the second pad electrode 280 may not include a separate contact area as shown in FIG. 2B and at least a portion of the whole second pad electrode 280 may be in contact with the second electrode 240.

FIGS. 4A through 4G are schematic cross-sectional views illustrating a method of manufacturing a semiconductor light emitting device according to an exemplary embodiment of the present disclosure. Specifically, FIGS. 4A through 4G illustrate an exemplary method of manufacturing the semiconductor light emitting device of FIG. 1, but the semiconductor light emitting device of FIGS. 2A through 3 may also be manufactured by a similar method.

Figure 4A:
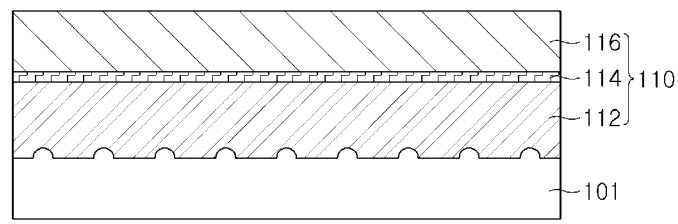
FIGS. 4A through 4G are schematic cross-sectional views illustrating a method of manufacturing a semiconductor light emitting device according to an exemplary embodiment of the present disclosure.

With reference to FIG. 4A, after an uneven structure is formed on a top surface of the substrate 101, the light emitting structure 110 including the first conductivity type semiconductor layer 112, the active layer 114 and the second conductivity type semiconductor layer 116 may be formed thereon.

As described above, the substrate 101 may be formed of sapphire, SiC, $MgAl_2O_4$, MgO, $LiAlO_2$, $LiGaO_2$, GaN or the like. The uneven structure may be formed on the top surface of the substrate 101 by forming a photoresist layer (not shown) on the substrate 101, irradiating the photoresist layer with light to form a pattern, and performing a dry-etching or wet-etching process. According to varying embodiments, a separate uneven structure may be formed using a material different from that of the substrate 101, such as a transparent insulator, a transparent conductor, or the like. When forming the uneven structure with a dry-etching process, an etching gas such as a fluorine-based gas (e.g., $CF_4$, $SF_6$ or the like) a chlorine-based gas (e.g., $Cl_2$, $BCl_3$ or the like) or Ar, may be used, but is not limited thereto.

Next, the first conductivity type semiconductor layer 112, the active layer 114 and the second conductivity type semiconductor layer 116 may be sequentially grown on the substrate 101 using a method such as metal organic chemical vapor deposition (MOCVD), hydride vapor phase epitaxy (HVPE), molecular beam epitaxy (MBE), or the like.

When the first conductivity type semiconductor layer 112 is grown on the substrate 101 having the uneven structure formed thereon, the first conductivity type semiconductor layer 112 is grown on a lateral surface of a convex portion of the uneven structure. A dislocation defect caused by a difference in lattice constants between the light transmissive substrate 101 and the first conductivity type semiconductor layer 112 may not be propagated upwardly but may be directed toward the lateral surface instead, due to lateral growth of the first conductivity type semiconductor layer 112. Therefore, a dislocation density within the grown first conductivity type semiconductor layer 112 in a direction parallel to a top surface of the substrate 101 may be significantly reduced, and thus, a high quality nitride semiconductor light emitting device may be manufactured.

Figure 4B:
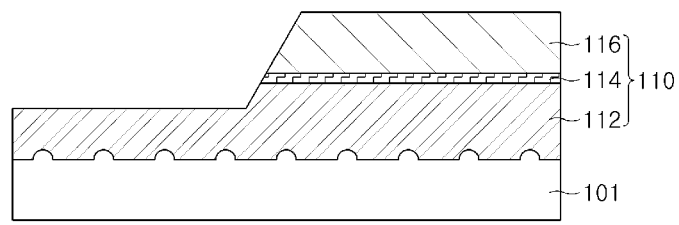

With reference to FIG. 4B, the second conductivity type semiconductor layer 116, the active layer 114, and the first conductivity type semiconductor layer 112 may be partially etched to expose at least a portion of the first conductivity type semiconductor layer 112.

A surface of the first conductivity type semiconductor layer 112 exposed by the etching process is used as a region for forming the first electrode 130 thereon (see FIG. 1). After a mask layer is formed on a region of the light emitting structure 110 other than the region for forming the first electrode 130, using a method similar to the method of forming the uneven structure on the substrate 101, a wet-etching or dry-etching process may be performed to thereby form a mesa-etched region. According to varying embodiments, the first conductivity type semiconductor layer 112 may not be etched, and the etching process may be performed to allow only a portion of a top surface of the first conductivity type semiconductor layer 112 to be exposed.

Figure 4C:
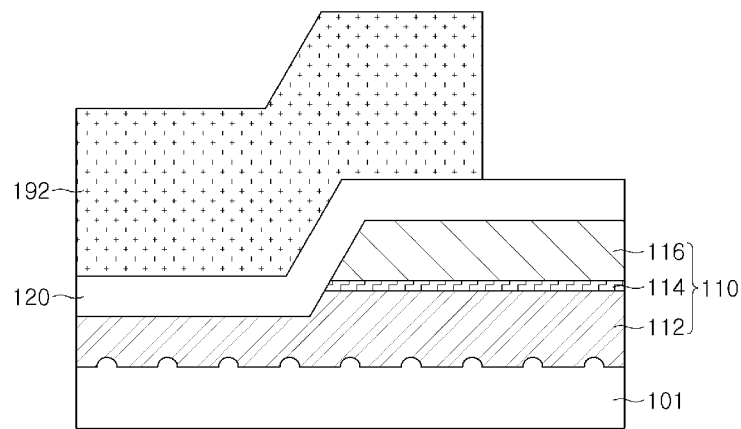

With reference to FIG. 4C, the first insulating layer 120 and a first mask layer 192 may be sequentially formed on the etched light emitting structure 110.

For example, the first insulating layer 120 may be formed of a silicon oxide or a silicon nitride, such as $SiO_2$, $SiO_xN_y$, $Si_xN_y$, or the like, and may be formed to have a thickness of approximately 5000 Å to 7000 Å by using a deposition process such as plasma enhanced chemical vapor deposition (PECVD) or the like.

Next, the first mask layer 192 may be formed on the first insulating layer 120 while allowing a region of the first insulating layer 120 for forming the second electrode 140 (see FIG. 1) to be exposed. The first mask layer 192 may be a photoresist layer.

Figure 4D:
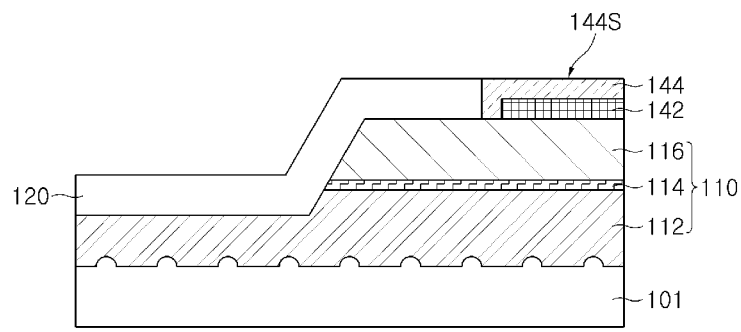

With reference to FIG. 4D, after a portion of the first insulating layer 120 is removed using the first mask layer 192, the contact layer 142 and the capping layer 144 of the second electrode 140 may be formed. The contact layer 142 and the capping layer 144 may be formed by physical vapor deposition (PVD), such as sputtering and electron beam evaporation, or chemical vapor deposition (CVD). In FIG. 4D, a height of a top surface of the capping layer 144 is equal to that of a top surface of the first insulating layer 120, but is not limited thereto. The height of the top surface of the capping layer 144 may be relatively lower than that of the top surface of the first insulating layer 120.

The contact layer 142 may be, for example, formed to have a stack structure of Ag/Ti/Ni, and have a thickness of 100 nm to 200 nm. The capping layer 144 may be, for example, formed to have a stack structure of Ti/Ni/Ti/Ni/Ti, and have a thickness of 400 nm to 600 nm. In addition, the capping layer 144 may include the capping surface layer 144S formed of at least one of Cr, Pt and Au.

After the contact layer 142 and the capping layer 144 are formed, the first mask layer 192 may be removed.

Figure 4E:
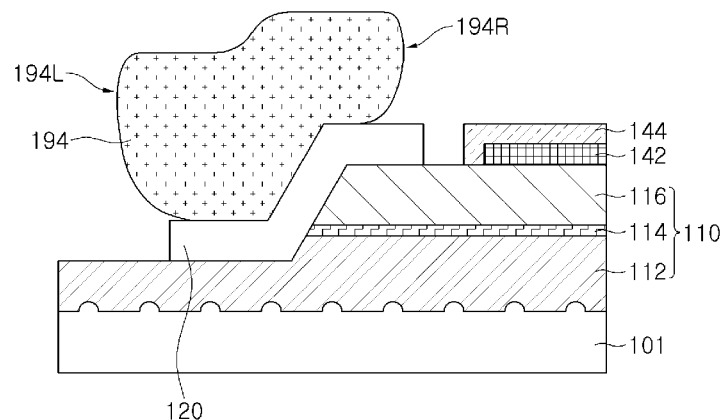

With reference to FIG. 4E, a second mask layer 194 may be formed on the first insulating layer 120 other than on a region of the first insulating layer 120 where the first electrode 130 and the metal buffer layer 146 (see FIG. 1) are to be formed.

The second mask layer 194 may be, for example, a negative photoresist layer. The second mask layer 194 may have inclined lateral surfaces 194L and 194R by adjusting coating thickness and light exposure conditions.

Next, a portion of the first insulating layer 120 exposed by the second mask layer 194 may be removed. For example, the first insulating layer 120 may be removed by a wet-etching process using a buffered oxide etchant containing a mixture of HF and $NH_4F$. As shown in FIG. 4E, the first insulating layer 120 may be retained below the lateral surfaces 194L and 194R of the second mask layer 194 by adjusting the etching process time. In addition, since the capping surface layer 144S (see FIG. 4D) of the second electrode 140 has a high degree of chemical resistance, the capping layer 144 and the contact layer 142 may be protected.

Figure 4F:
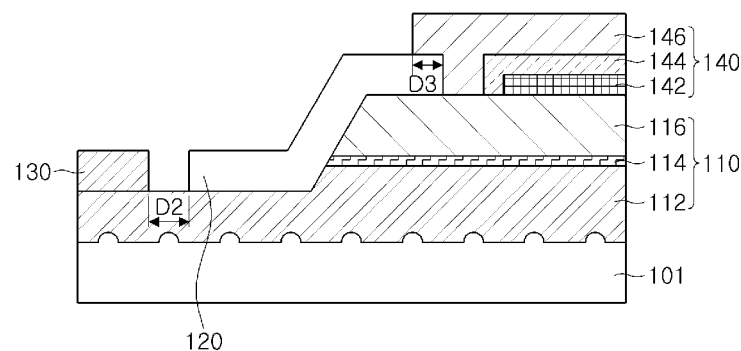

With reference to FIG. 4F, the first electrode 130 and the metal buffer layer 146 of the second electrode 140 may be formed.

The first electrode 130 and the metal buffer layer 146 may be formed of the same material, and may be formed by depositing the material on a top surface of the light emitting structure 110 in a linear manner from thereabove. According to the present exemplary embodiment, the first electrode 130 and the metal buffer layer 146 may be formed in the same process, such that the manufacturing process may be simplified and the manufacturing costs may be reduced.

For example, the first electrode 130 and the metal buffer layer 146 may be deposited by a sputtering method. The first electrode 130 disposed lower than the metal buffer layer 146 and having a relatively small size, may be spaced apart from the first insulating layer 120 by a predetermined distance D2 by the second mask layer 194 protruding outwardly from the first insulating layer 120 as shown in FIG. 4E. Alternatively, according to varying embodiments, the first electrode 130 may be in contact with the first insulating layer 120. The metal buffer layer 146 may overlap the first insulating layer 120 by a distance D3. The distance D3 of the overlap portion between the metal buffer layer 146 and the first insulating layer 120 may be changed according to varying embodiments.

After the first electrode 130 and the metal buffer layer 146 are formed, the second mask layer 194 may be removed.

Figure 4G:
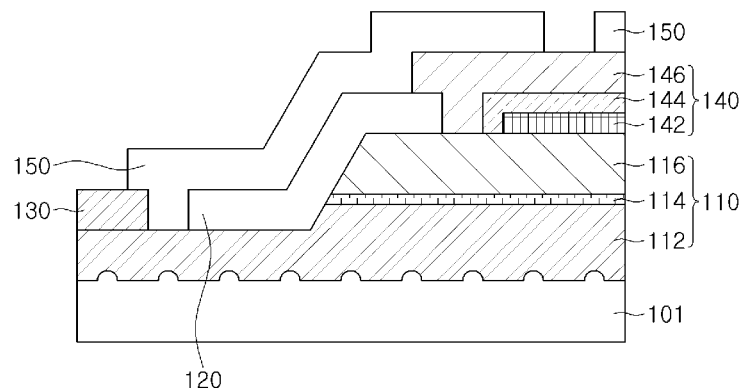

With reference to FIG. 4G, the second insulating layer 150 may be formed. Like the first insulating layer 120, the second insulating layer 150 may be formed of a silicon oxide or a silicon nitride, such as $SiO_2$, $SiO_xN_y$, $Si_xN_y$, or the like, and may be formed to have a thickness of approximately 7000 Å to 9000 Å by using a deposition process such as plasma enhanced chemical vapor deposition (PECVD) or the like.

The second insulating layer 150 may be formed by a patterning process while exposing portions of the first and second electrodes 130 and 140 in regions for forming the first and second pad electrodes 170 and 180 (see FIG. 1).

Then, with reference to FIG. 1 as well as FIG. 4G, the first and second pad electrodes 170 and 180 may be formed to be connected to the first and second electrodes 130 and 140, respectively, and thus, the semiconductor light emitting device 100 of FIG. 1 may be manufactured.

Figure 5A:
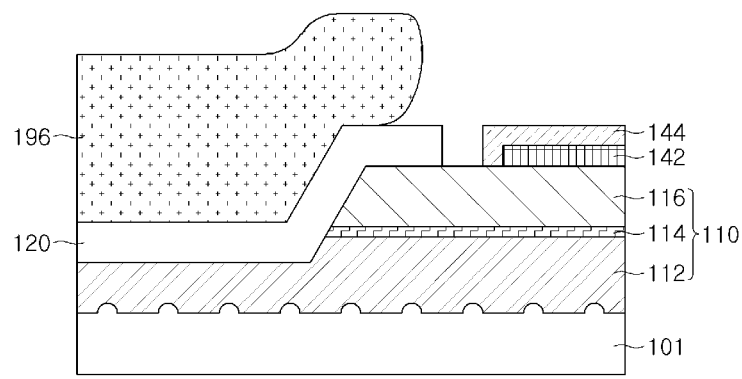
FIGS. 5A through 5C are schematic cross-sectional views illustrating a method of manufacturing a semiconductor light emitting device according to an exemplary embodiment of the present disclosure.
Figure 5B:
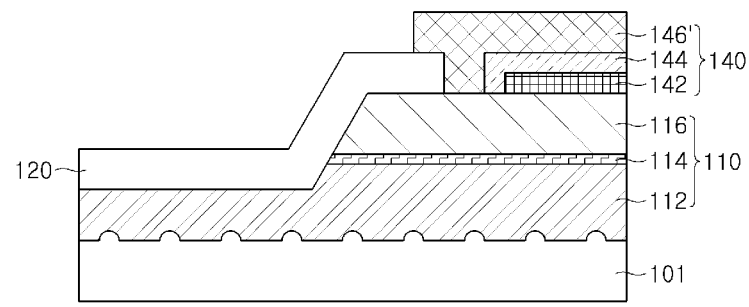
Figure 5C:
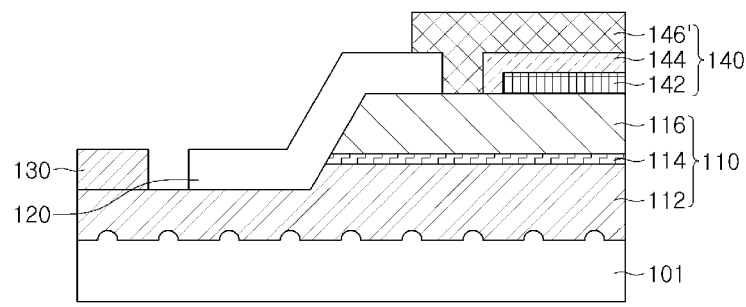

FIGS. 5A through 5C are schematic cross-sectional views illustrating a method of manufacturing a semiconductor light emitting device according to an exemplary embodiment of the present disclosure.

With reference to FIG. 5A, after the light emitting structure 110 is formed on the substrate 101, the light emitting structure 110 may be partially etched and the first insulating layer 120 may be formed thereon, as described above with reference to FIGS. 4A through 4C.

Next, a portion of the first insulating layer 120 may be removed from the region for forming the second electrode 140 (see FIG. 1). To enable this, a mask layer 196 may be formed which exposes the region for forming the second electrode 140 (see FIG. 1). For example, the mask layer 196 may be a negative photoresist layer, and may have lateral surfaces inclined by adjusting coating thickness and light exposure conditions.

A portion of the first insulating layer 120 exposed through the mask layer 196 may be removed by a wet-etching process. As shown in FIG. 5A, the first insulating layer 120 may be retained below the inclined lateral surfaces of the mask layer 196 by adjusting the etching process time.

Next, the contact layer 142 and the capping layer 144 of the second electrode 140 may be formed. The contact layer 142 and the capping layer 144 may be formed by depositing a deposition material on a top surface of the light emitting structure 110 in a linear manner from thereabove. At this time, the capping layer 144 may be formed to be spaced apart from the first insulating layer 120 by a predetermined distance.

With reference to FIG. 5B, a metal buffer layer 146' may be formed on the capping layer 144. The metal buffer layer 146' may be formed by a deposition method having a relatively low degree of linearity as compared to the deposition method used to form the contact layer 142 and the capping layer 144. Therefore, the metal buffer layer 146' may be formed on the capping layer 144 while filling a gap between the capping layer 144 and the first insulating layer 120. According to alternative embodiments, the metal buffer layer 146' may be spaced apart from the first insulating layer 120, while encompassing lateral and top surfaces of the capping layer 144.

According to the present exemplary embodiment, the second electrode 140 may be formed using a single mask layer 196, and thus the manufacturing process may be simplified and the manufacturing costs may be reduced.

With reference to FIG. 5C, the first electrode 130 may be formed. After a separate mask layer (not shown) is formed, a portion of the first conductivity type semiconductor layer 112 may be exposed by removing a portion of the first insulating layer 120 using the separate mask layer. Then, the first electrode 130 may be formed on the exposed portion of the first conductivity type semiconductor layer 112.

Then, the second insulating layer 150 and the first and second pad electrodes 170 and 180 may be sequentially formed, as described above with reference to FIG. 4G.

Figure 6:
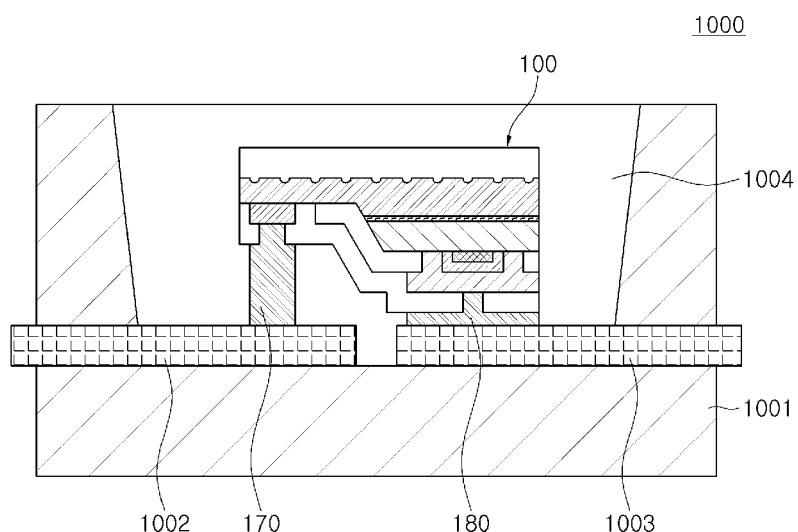
FIG. 6 illustrates an example of applying a semiconductor light emitting device to a package, according to an exemplary embodiment of the present disclosure.

FIG. 6 illustrates an example of applying a semiconductor light emitting device to a package, according to an exemplary embodiment of the present disclosure.

With reference to FIG. 6, a semiconductor light emitting device package 1000 may include a semiconductor light emitting device 100, a package body 1001, and lead frames 1002 and 1003. In addition, a sealing part 1004 may be formed to protect the semiconductor light emitting device 100.

The semiconductor light emitting device 100 may have the above-described structure of FIG. 1 or a structure similar thereto. The semiconductor light emitting device 100 may be disposed in a flip-chip manner, that is, in a direction in which first and second pad electrodes 170 and 180 are disposed toward the lead frames 1002 and 1003, respectively. In this case, the first and second pad electrodes 170 and 180 may be eutectic-bonded to the lead frames 1002 and 1003, thereby obtaining a high level of heat dissipation as compared to the use of solder bumps. In addition, the metal buffer layer 146 (see FIG. 1) may be formed to thereby prevent the occurrence and propagation of cracks at the time of bonding. Furthermore, the semiconductor light emitting device package 1000 according to the present exemplary embodiment does not require a wire bonding process, and thus, may avoid a reduction in reliability resulting from defects in the wire bonding process.

Meanwhile, such an exemplary structure of the semiconductor light emitting device package 1000 according to the present embodiment may be modified. For example, bottom surfaces of the lead frames 1002 and 1003 may be exposed by extending outwardly from the package body 1001. In this case, the sealing part 1004 may be provided to maintain the shape of the lead frames 1002 and 1003 in addition to protecting the semiconductor light emitting device 100. In addition, according to varying embodiments, the semiconductor light emitting device 100 may be mounted on a portion of the package 1000 other than the lead frames 1002 and 1003, for example, on the package body 1001.

Figure 7:
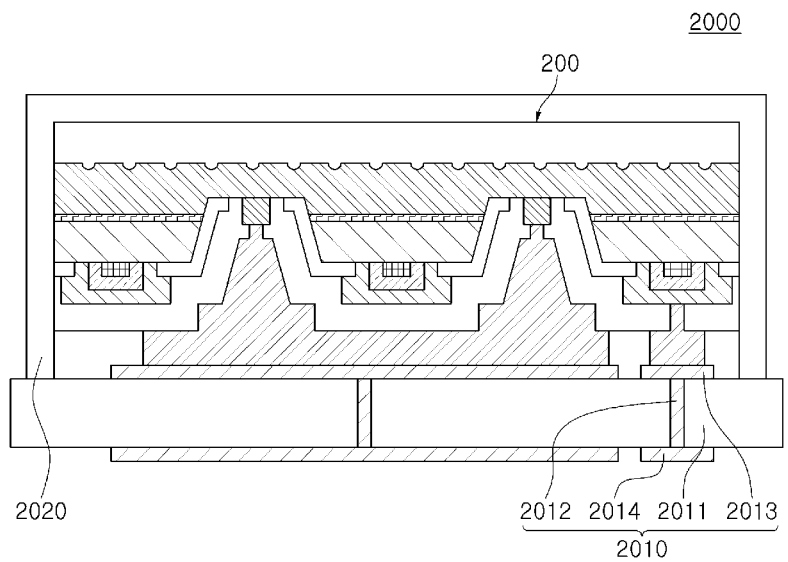
FIG. 7 illustrates an example of applying a semiconductor light emitting device to a package, according to an exemplary embodiment of the present disclosure.

FIG. 7 illustrates an example of applying a semiconductor light emitting device to a package, according to an exemplary embodiment of the present disclosure.

With reference to FIG. 7, a semiconductor light emitting device package 2000 may include a mounting substrate 2010 and a semiconductor light emitting device 200 mounted on the mounting substrate 2010. Here, the semiconductor light emitting device 200 may have the above-described structure of FIGS. 2A through 3 or a structure similar thereto. The semiconductor light emitting device 200 may be disposed in a flip-chip manner, that is, in a direction in which first and second pad electrodes 270 and 280 are disposed toward the mounting substrate 2010. In this case, the first and second pad electrodes 270 and 280 may be eutectic-bonded to the mounting substrate 2010, thereby obtaining a high level of heat dissipation as compared to the use of solder bumps and obtaining a high level of reliability as compared to the use of wire-bonding. In addition, the metal buffer layer 246 (see FIG. 3) may be formed to thereby prevent the occurrence and propagation of cracks at the time of bonding.

The mounting substrate 2010 may have an upper electrode 2013 formed on at least one surface thereof. The semiconductor light emitting device 200 may be disposed on the surface of the mounting substrate 2010 on which the upper electrode 2013 is formed, such that an electrical signal may be applied to the semiconductor light emitting device 200 through the upper electrode 2013.

The mounting substrate 2010 may include a substrate body 2011. The upper electrode 2013 may be formed on a first surface of the substrate body 2011. The mounting substrate 2010 may further include a plurality of vias 2012 penetrating through the substrate body 2011 in a thickness direction, and a lower electrode 2014 formed on a second surface of the substrate body 2011. The plurality of vias 2012 may electrically connect the upper electrode 2013 and the lower electrode 2014, and may dissipate heat generated in the semiconductor light emitting device 200 outwardly.

The substrate body 2011 may be formed of an organic resin material containing epoxy, triazin, silicon, polyimide, or the like, or other organic resin materials, or a ceramic material such as AlN, $Al_2O_3$, or the like, or a metal and a metal compound. In addition, the substrate 2010 may be provided as a printed circuit board (PCB), a metal core printed circuit board (MCPCB), a metal printed circuit board (MPCB), a flexible printed circuit board (FPCB), or the like, or may be provided as a pair of lead frames.

The semiconductor light emitting device 200 may be disposed on the surface of the substrate 2010 on which the upper electrode 2013 is formed, while the opposite surface, that is, the bottom surface, of the substrate 2010 may be provided with a wiring structure and a separate power supply device (not shown) for supplying power to the semiconductor light emitting device 200.

A wavelength conversion layer 2020 may be formed to enclose the semiconductor light emitting device 200, and may convert a wavelength of light emitted from the semiconductor light emitting device 200 into a different wavelength. The wavelength conversion layer 2020 may include a phosphor, a quantum dot, or the like.

According to varying embodiments, the substrate 201 (see FIG. 3) of the semiconductor light emitting device 200 may be removed. For removing the substrate 201, a wet-etching process, a dry-etching process or a laser lift off (LLO) process may be employed. The substrate 201 may be partially or entirely removed.

Figure 8:
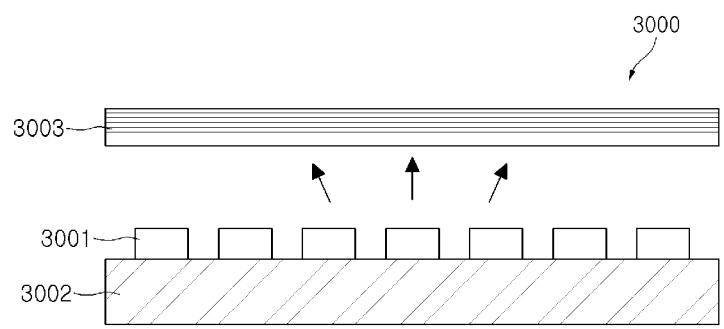
FIGS. 8 and 9 illustrate examples of applying a semiconductor light emitting device to backlight units, according to an exemplary embodiment of the present disclosure.
Figure 9:
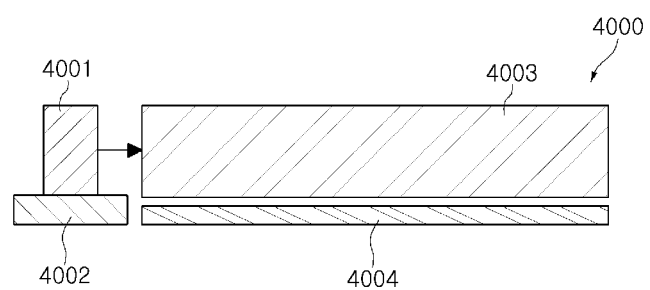

FIGS. 8 and 9 illustrate examples of applying a semiconductor light emitting device to backlight units, according to an exemplary embodiment of the present disclosure.

With reference to FIG. 8, a backlight unit 3000 includes a light source 3001 mounted on a substrate 3002 and at least one optical sheet 3003 disposed thereabove. The light source 3001 may be a semiconductor light emitting device package having the above-described structure of FIGS. 6 and 7 or a structure similar thereto. Alternatively, a semiconductor light emitting device may be directly mounted on the substrate 3002 in a chip-on-board (COB) scheme.

The light source 3001 in the backlight unit 3000 of FIG. 8 emits light toward a liquid crystal display (LCD) device disposed thereabove. In an alternative embodiment shown in FIG. 9, a light source 4001 mounted on a substrate 4002 in a backlight unit 4000 emits light laterally, and the light is incident to a light guide plate 4003 such that the backlight unit 4000 may serve as a surface light source. The light travelling to the light guide plate 4003 may be emitted upwardly, and a reflective layer 4004 may be formed under a bottom surface of the light guide plate 4003 to improve light extraction efficiency.

Figure 10:
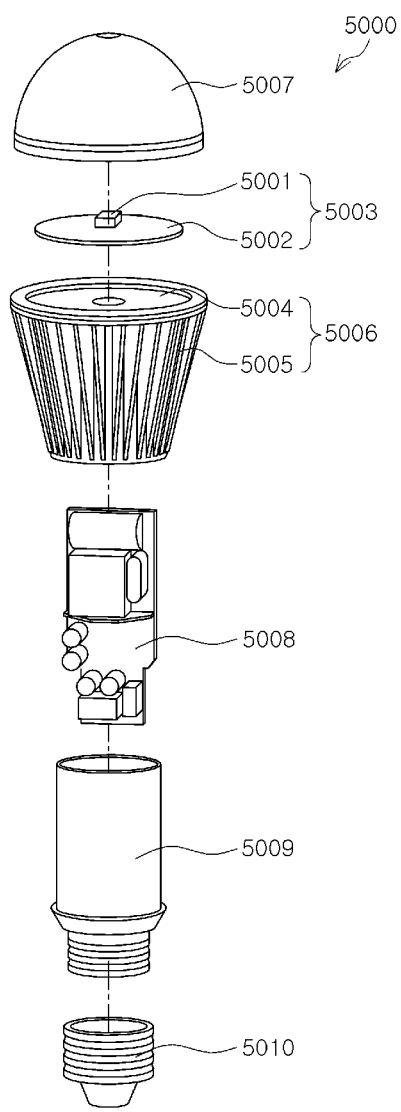
FIG. 10 illustrates an example of applying a semiconductor light emitting device to a lighting device, according to an exemplary embodiment of the present disclosure.

FIG. 10 illustrates an example of applying a semiconductor light emitting device to a lighting device, according to an exemplary embodiment of the present disclosure.

With reference to an exploded perspective view shown in FIG. 10, a lighting device 5000 is exemplified as a bulb-type lamp, and includes a light emitting module 5003, a driving unit 5008 and an external connector unit 5010. In addition, exterior structures, such as respective external and internal housings 5006 and 5009, a cover unit 5007, and the like, may be additionally included. The light emitting module 5003 may include a light source 5001 having the above-described semiconductor light emitting device package structure of FIGS. 6 and 7 or a structure similar thereto, and a circuit board 5002 having the light source 5001 mounted thereon. In the present exemplary embodiment, a single light source 5001 is mounted on the circuit board 5002; however, if necessary, a plurality of light sources may be mounted thereon.

The external housing 5006 may serve as a heat radiating part, and may include a heat sink plate 5004 in direct contact with the light emitting module 5003 to thereby improve heat dissipation, and a heat radiating fin 5005 surrounding a lateral surface of the lighting device 5000. The cover unit 5007 may be disposed above the light emitting module 5003 and have a convex lens shape. The driving unit 5008 may be disposed inside the internal housing 5009 and connected to the external connector unit 5010, such as a socket structure, to receive power from an external power source. In addition, the driving unit 5008 may convert the received power into power appropriate for driving the light source 5001 of the light emitting module 5003 and supply the converted power thereto. For example, the driving unit 5008 may be provided as an AC-DC converter, a rectifying circuit part, or the like.

In addition, although not shown, the lighting device 5000 may further include a communications module.

Figure 11:
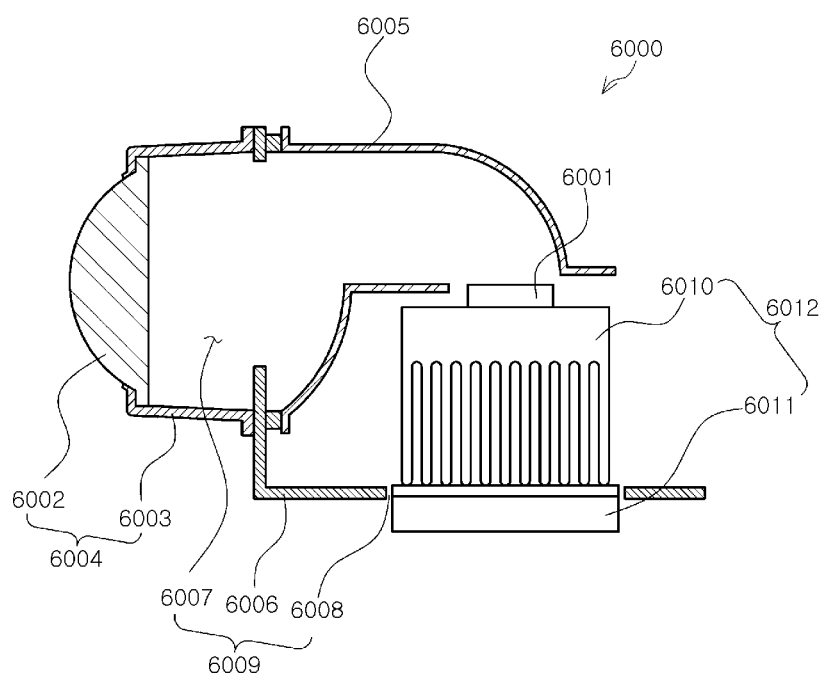
FIG. 11 illustrates an example of applying a semiconductor light emitting device to a headlamp, according to an exemplary embodiment of the present disclosure.

FIG. 11 illustrates an example of applying a semiconductor light emitting device to a headlamp, according to an exemplary embodiment of the present disclosure.

With reference to FIG. 11, a headlamp 6000 used in a vehicle or the like may include a light source 6001, a reflective unit 6005 and a lens cover unit 6004. The lens cover unit 6004 may include a hollow guide part 6003 and a lens 6002. The light source 6001 may include at least one of the above-described semiconductor light emitting device packages of FIGS. 6 and 7.

The headlamp 6000 may further include a heat radiating unit 6012 which can dissipate heat generated in the light source 6001 outwardly. The heat radiating unit 6012 may include a heat sink 6010 and a cooling fan 6011 to effectively dissipate heat. In addition, the headlamp 6000 may further include a housing 6009 which can allow the heat radiating unit 6012 and the reflective unit 6005 to be fixed thereto for supporting them. One surface of the housing 6009 may be provided with a housing body 6006 and a central hole 6008 into which the heat radiating unit 6012 is inserted to be coupled thereto.

The other surface of the housing 6009 bent in a direction quadrangular to one surface of the housing 6009 may be provided with a forwardly open hole 6007 such that light generated by the light source 6001 may be reflected by the reflective unit 6005 disposed above the light source 6001, pass through the forwardly open hole 6007, and be emitted outwardly.

As set forth above, according to exemplary embodiments of the present disclosure, a semiconductor light emitting device can achieve improved reliability by preventing or reducing the occurrence of cracks in electrodes and insulating layers around the electrodes.

While the present disclosure has been shown and described in connection with the exemplary embodiments, it will be apparent to one of ordinary skill in the art that modifications and variations can be made without departing from the spirit and scope of the present disclosure as defined by the appended claims.

What is claimed is:

1. A semiconductor light emitting device comprising:
   a light emitting structure including a first conductivity type semiconductor layer, an active layer, and a second conductivity type semiconductor layer;
   a first electrode connected to the first conductivity type semiconductor layer;
   a second electrode including a contact layer connected to the second conductivity type semiconductor layer, a capping layer disposed on the contact layer, and a metal buffer layer disposed on the capping layer, the metal buffer layer encompasses an upper and lateral surface of the capping layer;
   a first insulating layer disposed on the light emitting structure such that the first and second electrodes are exposed; and
   a second insulating layer disposed on the first insulating layer such that at least a portion of the first electrode and at least a portion of the metal buffer layer are exposed.

2. The semiconductor light emitting device of claim 1, wherein the first electrode and the metal buffer layer are formed of the same material.

3. The semiconductor light emitting device of claim 1, wherein the metal buffer layer is thicker than the contact layer or the capping layer.

4. The semiconductor light emitting device of claim 1, wherein a gap is arranged between the capping layer and the first insulating layer, and
the gap is filled with the metal buffer layer.

5. The semiconductor light emitting device of claim 1, wherein the metal buffer layer encompasses an end portion of the first insulating layer.

6. The semiconductor light emitting device of claim 1, wherein the metal buffer layer is formed of a material having a degree of fracture toughness higher than a degree of fracture toughness of a material forming the capping layer.

7. The semiconductor light emitting device of claim 1, wherein the capping layer includes a capping surface layer contacting the metal buffer layer, the capping surface layer being formed of at least one of Cr, Pt and Au.

8. The semiconductor light emitting device of claim 1, wherein the capping layer includes at least one of Ti and Ni, and
the metal buffer layer includes at least one of Au, Ag, Al, Pt, Fe, Cu, Sn, Pb, Ni, and Pd, and alloys thereof.

9. The semiconductor light emitting device of claim 1, wherein the first electrode is disposed on a part of the first conductivity type semiconductor layer exposed by etching a portion of the light emitting structure.

10. The semiconductor light emitting device of claim 9, wherein the first insulating layer extends from an exposed part of the first conductivity type semiconductor layer to a top of the second conductivity type semiconductor layer, the first insulating layer covering a lateral surface of the light emitting structure.

11. The semiconductor light emitting device of claim 1, wherein the first electrode and the second electrode are disposed in a same direction.

12. The semiconductor light emitting device of claim 1, further comprising a first pad electrode disposed on the first electrode and a second pad electrode disposed on a portion of the metal buffer layer exposed by the second insulating layer.

13. The semiconductor light emitting device of claim 1, wherein the first electrode includes at least one conductive via penetrating through the second conductivity type semiconductor layer and the active layer and connected to the first conductivity type semiconductor layer.

14. A semiconductor light emitting device comprising:
a light emitting structure including a first conductivity type semiconductor layer, an active layer, and a second conductivity type semiconductor layer;
first and second electrodes connected to the first and second conductivity type semiconductor layers, respectively;
an insulating layer disposed on the first and second electrodes; and
a metal buffer layer disposed on the second electrode,
wherein the metal buffer layer is formed of a material having a degree of fracture toughness higher than a degree of fracture toughness of a material forming the second electrode, and
the metal buffer layer is arranged on a side surface of at least one of the second electrode and the insulating layer.

* * * * *